(12) United States Patent
Kim et al.

(10) Patent No.: US 9,519,166 B2
(45) Date of Patent: Dec. 13, 2016

(54) CIRCUIT SUBSTRATE, DISPLAY PANEL AND DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 14/469,559

(22) Filed: Aug. 26, 2014

(65) Prior Publication Data

US 2015/0366053 A1 Dec. 17, 2015

(30) Foreign Application Priority Data

Jun. 13, 2014 (CN) .......................... 2014 1 0265488

(51) Int. Cl.
| | | |
|---|---|---|
| *G02F 1/1345* | (2006.01) | |
| *G02F 1/133* | (2006.01) | |
| *H05K 1/11* | (2006.01) | |
| *H05K 3/36* | (2006.01) | |

(52) U.S. Cl.
CPC .............. *G02F 1/133* (2013.01); *H05K 1/119* (2013.01); *H05K 3/361* (2013.01); *H05K 2201/09045* (2013.01); *H05K 2203/0278* (2013.01)

(58) Field of Classification Search
None
See application file for complete search history.

(56) References Cited

U.S. PATENT DOCUMENTS

| 5,759,047 A | 6/1998 | Brodsky et al. |
| 6,507,113 B1 | 1/2003 | Fillion et al. |
| 2006/0038298 A1* | 2/2006 | Park .................... G02F 1/13452 257/772 |

FOREIGN PATENT DOCUMENTS

| CN | 1670578 | 9/2005 |
| CN | 202166802 | 3/2012 |
| CN | 103200788 | 7/2013 |

OTHER PUBLICATIONS

Chinese Office Action with English Language Translation, dated May 18, 2016, Chinese Application No. 201410265488.0.

* cited by examiner

*Primary Examiner* — Richard Kim
(74) *Attorney, Agent, or Firm* — Blakely Sokoloff Taylor & Zafman LLP

(57) ABSTRACT

This disclosure provides a circuit substrate, a display panel and a display device for solving the problem of a relatively large electrode pitch of the circuit substrate in the prior art while reducing the production cost. Wherein the circuit substrate comprises a substrate, a plurality of first electrodes arranged on the substrate, and insulating convex structures arranged between the substrate and the first electrodes, the convex structure comprising a top face and a bottom face, wherein the top face contacts with the first electrode, and the bottom face contacts with the substrate.

18 Claims, 2 Drawing Sheets

US 9,519,166 B2

CIRCUIT SUBSTRATE, DISPLAY PANEL AND DISPLAY DEVICE

TECHNICAL FIELD

This disclosure relates to the field of display technology, especially relates to a circuit substrate, a display panel and a display device.

BACKGROUND OF THE INVENTION

With the continuous development of the Thin Film Transistor Liquid Crystal Display (TFT-LCD) technology, the LCD manufacturers are in pursuit of the lowest cost and the maximum production efficiency continually. The cost of the module material occupies about 50% of the total cost of the LCD material, thus reducing the material cost of the module has direct significance to the reduction of the whole cost. Whereas the significance of the fine pitch technology lies in favor of reducing the electrode pitch, reducing the production cost and increasing the pressing efficiency, so as to maximize the capacity of production; therefore, further improving the fine pitch technological capacity becomes a long-term target pursued by many LCD vendors.

FIG. 1 is a structural schematic view of a connecting structure by pressing of an array substrate and a flexible circuit board in the prior art. As shown in FIG. 1, the array substrate comprises a first substrate 101 and a plurality of first electrodes 102 arranged on the first substrate 101; the flexible circuit board comprises a second substrate 103 and second electrodes 104 arranged on the surface of the second substrate 103; the first electrodes 102 and the second electrodes 104 are electrically connected through Anisotropic Conductive Films (ACF). The ACF comprises two primary substances, respectively conducting particles 105 and thermosetting resins. The first electrodes 102 and the second electrodes 104 are connected together through the conducting particles 105 by means of the pressing process, so as to realize circuit conduction, wherein the thermosetting resins play the function of physical connection and ensure connection intensity.

With the development of the liquid crystal panel towards the direction of high resolution, the number of leads on the array substrate increases correspondingly. If the electrode pitch (which refers to the distance between the same positions of two adjacent first electrodes 102) is not shortened, the area of the array substrate will be increased, and the cost will also be increased correspondingly, this is unfavorable for control of the production cost, so it becomes very important to shorten the electrode pitch and optimize the fine pitch.

In the connecting structure by pressing of the array substrate and the flexible circuit board, Pitch=W+G+2M, wherein M represents the offset, which refers to the offset of the center of the first electrode 102 and the center of the corresponding second electrode 104, the offset is caused by the accuracy problem of pressing apparatus, which cannot be avoided and can only be reduced as much as possible; G represents the minimum insulating distance, which refers to the minimum distance allowed between the first electrode 102 and the next second electrode 104 of the flexible circuit board, i.e., the minimum distance set for ensuring no short circuit between two adjacent electrodes, the minimum insulating distance is related to the size and density of the conducting particles within the ACF, the larger the conducting particles and the higher the density is (i.e., the better the conductivity is), the larger the minimum insulating distance will be required, vice versa, the minimum insulating distance will be smaller, while the fine pitch requires the minimum insulating distance the smaller the better; W represents the minimum pressing width, which refers to the minimum overlapping width of the first electrode 102 and the second electrode 104 required for ensuring conduction and stability of the circuit. The minimum pressing width is related to the density of the conducting particles, the larger the density of the conducting particles is, and the larger the number of conducting particles within the unit area is, the larger the conducting area is (the better the conductivity is), thus the overlapping width can be shortened, the minimum pressing width will be small, which is a result desired by the fine pitch. However, the minimum insulating distance requires a relatively small density of the conducting particles, while the minimum pressing width requires increase of the density of the conducting particles, the two cannot be met simultaneously, so the fine pitch optimization level in the current industry still cannot further reduce the pitch between respective electrodes effectively.

SUMMARY OF THE INVENTION

Embodiments of the present invention provide a circuit substrate, a display panel and a display device, which can eliminate or at least mitigate one or more of the above problems.

An embodiment of the present invention provides a circuit substrate comprising a substrate and a plurality of first electrodes arranged on the substrate, the circuit substrate further comprises insulating convex structures arranged between the substrate and the first electrodes, the convex structure comprising a top face and a bottom face, wherein the top face contacts with the first electrode, and the bottom face contacts with the substrate.

The circuit substrate comprises insulating convex structures arranged between the substrate and the first electrodes, the convex structure comprises a top face and a bottom face, wherein the top face contacts with the first electrode, and the bottom face contacts with the substrate, such that the height between the first electrode and the substrate is increased. During the process of pressing the circuit substrate and the corresponding flexible circuit board together by means of the subsequent pressing process, the circuit substrate and the flexible circuit board can be electrically connected by the first electrodes and the second electrodes in the flexible circuit board, and it is unnecessary to arrange ACF between the first electrodes and the second electrodes, which eliminates the limitation of the ACF to the pressing width and the minimum insulating width, and enables good conduction of the first electrodes and the second electrodes in the case of a very small pressing width, thereby solving the problem of a relatively large electrode pitch of the circuit substrate in the prior art while reducing the production cost.

According to one embodiment, the convex structure has a height of 1-2 μm in a direction perpendicular to the substrate. The convex structure can be easily formed within this height range. In addition, the height range of the convex structure can be enlarged to 0.5-3 μm, however, if the height of the convex structure is relatively small, it will not be easy to form the convex structure, while if the height of the convex structure is relatively large, the whole width of the convex structure will be increased, which may be unfavorable for reducing the electrode pitch of the circuit substrate.

According to another embodiment, the shape of the top face of the convex structure matches with the shape of the first electrode. Generally, the shape of the top face can be the same as the shape of the first electrode; or, the area of the top face is equal to or slightly larger than the coverage area of the first electrode, such that the first electrode is completely formed on the top face, the contact area of the first electrode with other electrodes can be increased so as to realize good conduction.

According to another embodiment, the bottom faces of the convex structures are connected with one another and cover the substrate. Two adjacent bottom faces are connected with each other such that the convex structure can be prevented from sliding effectively, which is favorable for increasing pressing accuracy.

According to a further embodiment, the area of the top face of the convex structure is smaller than the area of the bottom face of the convex structure. When the area of the bottom face is relatively large, it is favorable for preventing the convex structure from sliding.

According to yet another embodiment, the section plane of the convex structure in a direction perpendicular to the extending direction of the first electrode and perpendicular to the substrate is in the shape of a trapezoid. When the section plane is in the shape of a trapezoid, the surface of the top face of the convex structure is relatively flat, which is favorable for forming the first electrodes above the trapezoid; meanwhile the relatively wide bottom face can prevent the convex structure from sliding effectively. In addition, the section plane of the convex structure can also be in other shapes, such as a square, a rectangle, etc.

According to yet another embodiment, the convex structure is made of a resin material. Because the resin material can be easily shaped, it is easy to form the convext structure. In addition, the convex structure can also be made of other inorganic insulating materials, such as silicon nitride or silicon oxide, etc. However, the fabricating process of using inorganic insulating materials is relatively complex and the production cost is relatively high.

An embodiment of the present invention provides a display panel comprising a circuit substrate and a flexible circuit board located on the circuit substrate, wherein the circuit substrate is the above circuit substrate.

The circuit substrate in the display panel comprises insulating convex structures arranged between the substrate and the first electrodes, the convex structure comprises a top face and a bottom face, wherein the top face contacts with the first electrode, the bottom face contacts with the substrate, such that the height between the first electrode and the substrate is increased. During the process of pressing the circuit substrate and the flexible circuit board together by means of the subsequent pressing process, the circuit substrate and the flexible circuit board can be electrically connected by the first electrodes and the second electrodes in the flexible circuit board, and it is unnecessary to arrange ACF between the first electrodes and the second electrodes, which eliminates the limitation of the concentration of the conducting particles in the ACF to the pressing width and the minimum insulating width, and enables the good conduction of the first electrodes and the second electrodes in the case of a very small pressing width, thereby solving the problem of a relatively large electrode pitch of the circuit substrate in the prior art while reducing the production cost.

According to one embodiment, the section plane of the convex structure in a direction perpendicular to the extending direction of the first electrode and perpendicular to the substrate is in the shape of a trapezoid. When the section plane is in the shape of a trapezoid, the surface of the top face of the convex structure is relatively flat, which is favorable for forming the first electrodes above the trapezoid; meanwhile the relatively wide bottom face can prevent the convex structure from sliding effectively. In addition, the section plane of the convex structure can also be in other shapes, such as a square, a rectangle, etc.

According to another embodiment, the flexible circuit board is provided with second electrodes corresponding to each of the first electrodes respectively, the side of the trapezoid that contacts with the first electrode is a top side of the trapezoid, the side of the trapezoid that contacts with the substrate is the a bottom side of the trapezoid; the width of the top side of the trapezoid is not larger than a spacing distance between two adjacent second electrodes; the width of the bottom side of the trapezoid is equal to a distance between the same positions of two adjacent second electrodes. In actual process, the width of the second electrode may be larger than the spacing distance between two adjacent second electrodes; when the width of the top side is not larger than the spacing distance between two adjacent second electrodes, the case of one first electrode connecting two second electrodes simultaneously will not occur, which is favorable for preventing short circuit caused by the first electrode located on the top face connecting two adjacent second electrodes simultaneously, short circuit between two adjacent second electrodes of the flexible circuit board can be prevented effectively even in the case of a relatively large pressing offset; meanwhile, the bottom faces of the convex structures can be connected with one another, such that the convex structure can be prevented from sliding, which is favorable for increasing pressing accuracy.

According to a further embodiment, the first electrodes arranged on the circuit substrate are in direct connection with the second electrodes arranged on the flexible circuit board, which eliminates the limitation of the concentration of the conducting particles in the ACF to the pressing width and the minimum insulating width, and enables the good conduction of the first electrode and the second electrode also in the case of a very small pressing width.

According to yet another embodiment, a face for contacting with the flexible circuit board of a press head for fabricating the display panel is in a dentate structure. Because the height of the convex structure in the circuit substrate may be uneven, some first electrodes and corresponding second electrodes may not be connected or may be poorly connected during the pressing process of fabricating the display panel. By designing the face of the press head for contacting with the flexible circuit board to be a dentate structure, the flexible circuit board can produce a deformation with the same shape during the pressing process, thereby eliminating poor connection caused by uneven heights of the convex structures.

An embodiment of the present invention provides a display device, the display device comprises the above display panel.

DETAILED DESCRIPTION OF EMBODIMENTS

Figure 1:
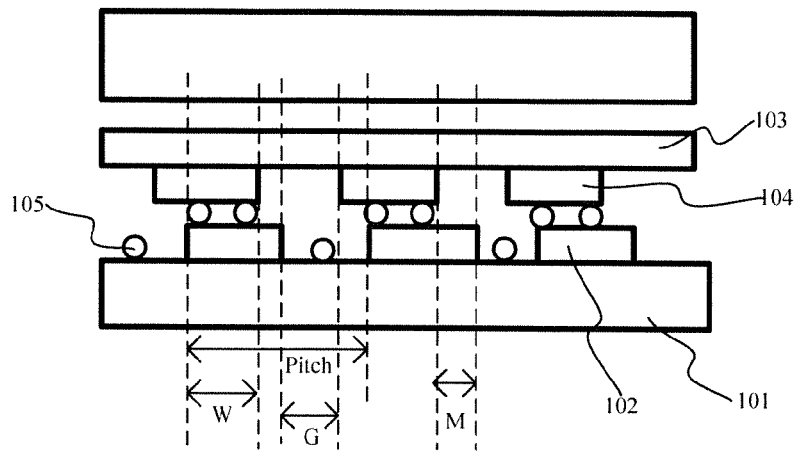
FIG. 1 is a structural schematic view of pressing of an array substrate and a flexible circuit board.

Embodiments of the present invention provides a circuit substrate, a display panel and a display device, which can solve the problem of a relatively large electrode pitch of the circuit substrate in the prior art while reducing the production cost.

Hereinafter, the technical solutions in the embodiments of the present invention will be described clearly and completely in combination with the drawings in the embodiments of the present invention. Apparently, the described embodiments are only part of the embodiments of the present invention rather than all the embodiments. The scope of the present invention is not limited to the described specific embodiments. In addition, it needs to be noted that the drawings are only used to illustrate the present invention schematically, and they are not drawn to scale nor limitations to the present invention.

An embodiment of the present invention provides a circuit substrate comprising a substrate and a plurality of first electrodes arranged on the substrate, wherein the circuit substrate further comprises insulating convex structures arranged between the substrate and the first electrodes, the convex structure comprising a top face and a bottom face, wherein the top face contacts with the first electrode, and the bottom face contacts with the substrate.

According to one embodiment, the convex structure may have a height of 1-2 μm in a direction perpendicular to the substrate. The convex structure can be easily formed within this height range.

According to another embodiment, the shape of the top face of the convex structure can match with the shape of the first electrode.

According to another embodiment, the bottom faces of the convex structures can be connected with one another and cover the substrate. When the bottom faces of the convex structures are connected with one another, the convex structures can be prevented from sliding effectively, so as to increase pressing accuracy.

According to a further embodiment, the area of the top face of the convex structure can be smaller than the area of the bottom face of the convex structure. When the area of the bottom face is relatively large, it is favorable for preventing the convex structure from sliding effectively.

According to yet another embodiment, the section plane of the convex structure in a direction perpendicular to the extending direction of the first electrode and perpendicular to the substrate can be in the shape of a trapezoid. When the section plane is in the shape of a trapezoid, the surface of the top face of the convex structure is relatively flat, which is favorable for forming the first electrodes above the trapezoid; meanwhile it is favorable for connecting the bottom faces of the convex structures together, so as to prevent the convex structures from sliding.

According to yet another embodiment, the convex structure can be made of a resin material, because the resin material can be easily shaped and so it is easy to form the convex structure. In addition, the convex structure can also be made of other inorganic insulating materials, such as silicon nitride or silicon oxide, etc. However, the fabricating process of using inorganic insulating materials is relatively complex and the production cost is relatively high.

An embodiment of the present invention further provides a display panel comprising a circuit substrate and a flexible circuit board located on the circuit substrate, wherein the circuit substrate is the above circuit substrate. In the display panel, the circuit substrate can be an array substrate of the display panel, and the first electrodes can be scan lines or data lines of the display panel.

Figure 2:
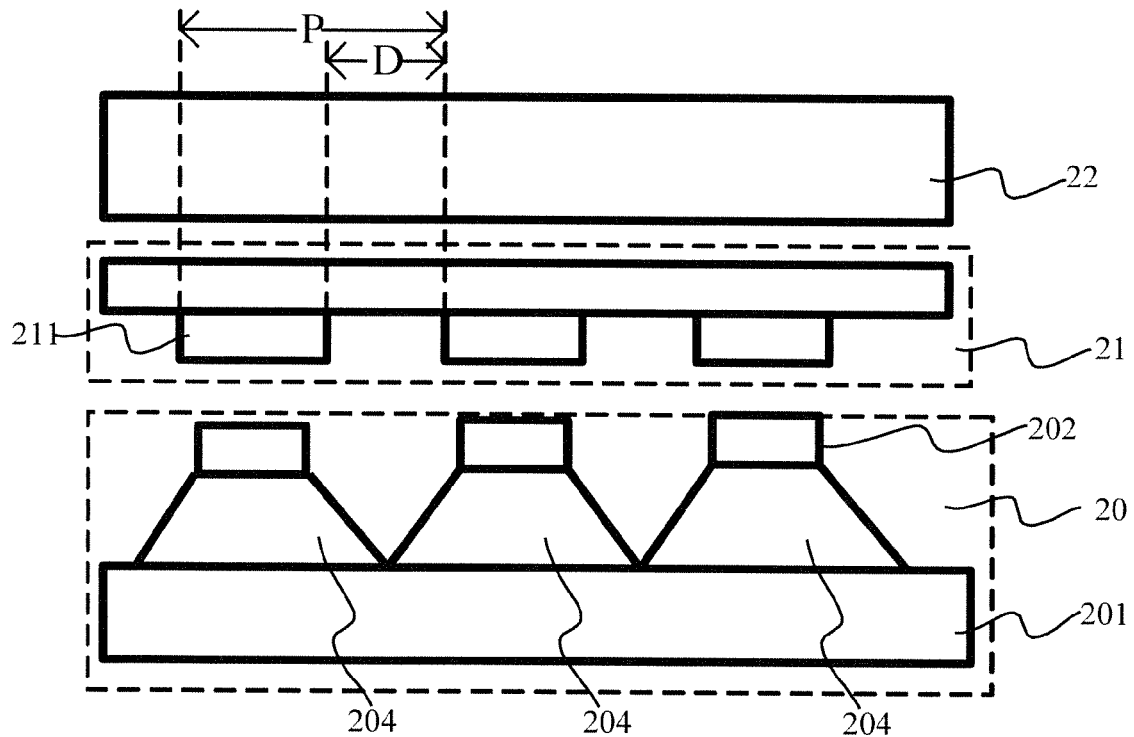
FIG. 2 is a schematic view of a connecting structure by pressing of a display panel according to an embodiment of the present invention.

Optionally, referring to FIG. 2, the display panel according to the embodiment of the present invention may comprise a circuit substrate 20 and a flexible circuit board 21 located on the circuit substrate 20. FIG. 2 also shows a press head 22 located on the flexible circuit board 21 which is used in the fabricating process of the display panel.

Wherein the circuit substrate 20 may comprise a substrate 201, a plurality of first electrodes 202 arranged above the substrate 201, and insulating convex structures 204 arranged between the substrate 201 and the first electrodes 202, which correspond to each of the first electrodes 202 respectively. The convex structure comprises a top face and a bottom face. Wherein each of the first electrodes 202 can be located above a corresponding convex structure 204, and the first electrodes 202 in the circuit substrate 20 can be connected with the flexible circuit board 21 directly. The flexible circuit board 21 may comprise second electrodes 211 corresponding to each of the first electrodes 202 respectively. The first electrodes 202 arranged on the circuit substrate 20 can for example be connected with the second electrodes 211 arranged on the flexible circuit board 21 directly. A press head 22 for example is in a plate-shape structure made of a metal material, and the face of the press head 22 for contacting with the flexible circuit board can be a flat surface.

The convex structure 204 may have a height of 0.5-3 μm in a direction perpendicular to the substrate. When the height of the convex structure 204 is relatively small, it is not easy to form the convex structure 204, while when the height of the convex structure 204 is relatively large, the whole width of the convex structure 204 may be increased, which is unfavorable for reducing the electrode pitch of the circuit substrate 20. Therefore, according to one embodiment, the height of the convex structure 204 for example may be 1-2 μm, since it is relatively easy to form the convex structure 204 within this height range, meanwhile, it is also favorable for controlling the whole width of the convex structure 204.

According to one embodiment, the shape of the top face of the convex structure 204 can match with the shape of the first electrode. For example, the shape of the top face of the convex structure can be same as the shape of the first electrode; or, the area of the top face of the convex structure can be equal to or slightly larger than the coverage area of the first electrode, such that the first electrode can be formed on the top face completely, the contact area of the first electrode with other electrodes can be increased so as to realize good conduction.

According to another embodiment, the bottom faces of the convex structures 204 can be connected with one another and cover the substrate. Two adjacent bottom faces are connected together, which can prevent the convex structures from sliding effectively, and is favorable for increasing pressing accuracy.

The section plane of the convex structure in a direction perpendicular to the extending direction of the first electrode and perpendicular to the substrate can be in the shape of a trapezoid, for example, as shown in FIG. 2. The side of the trapezoid contacting with the first electrode 202 is a top side of the trapezoid, and the side of the trapezoid contacting with the substrate 201 is a bottom side of the trapezoid. When the section plane is in the shape of a trapezoid, the surface of the top face of the convex structure 204 is relatively flat, which is favorable for forming the first electrodes 202 above the trapezoid; meanwhile it is favorable for the bottom faces of the convex structures 204 connecting with one another, preventing the convex structure from sliding, and increasing pressing accuracy. In addition, the section plane of the convex structure 204 can also be in other shapes, such as a square, a rectangle, etc.

According to one embodiment, the width of the top side of the trapezoid is not larger than a spacing distance D between two adjacent second electrodes 211. In the actual process, the width of the second electrode 211 can be larger than the spacing distance D between two adjacent second electrodes 211; hence, when the width of the top side is not larger than the spacing distance D between two adjacent second electrodes, the case of one first electrode connecting two second electrodes simultaneously will not occur, which is favorable for preventing short circuit caused by the first electrode located on the top face connecting two adjacent second electrodes simultaneously, the case of short circuit between two adjacent second electrodes will not occur even in the case of a relatively large pressing offset.

The width of the bottom side of the trapezoid can be equal to the distance between the same positions (e.g., left ends of two second electrodes 211 as shown in FIG. 2) of two adjacent second electrodes 211, i.e., the electrode pitch P of the flexible circuit board 21. When the width of the bottom side of the trapezoid is equal to the distance between the same positions of two adjacent second electrodes 211, the bottom faces of the convex structures can be connected with one another, hence, the convex structures 204 can be prevented from sliding effectively, which is favorable for increasing the pressing accuracy.

According to one embodiment, the convex structure 204 can be made of a resin material. Since the resin material has a relatively low hardness, and is easy to be shaped, it is easier to form the convex structure 204 by using the resin material. In addition, the convex structure 204 can also be made of other inorganic insulating materials, such as silicon nitride or silicon oxide, etc. However, the fabricating process of using inorganic insulating materials is relatively complex and the production cost is relatively high.

Optionally, it can be realized using the following parameters: the section plane of the convex structure 204 is in the shape of a trapezoid narrow at the top and wide at the bottom, the height of the trapezoid is 1-2 μm, the width of the top side is about 2 μm, the width of the bottom side is about 5 μm, the width of the first electrode 202 is the same as the width of the top side, which is about 2 μm.

Here, the electrode pitch P (i.e., the distance between the same positions of two adjacent second electrodes 211) of the flexible circuit board 21 corresponding to the circuit substrate 20 is about 5 μm, which is the same as the width of the bottom side of the trapezoid; the spacing distance D between two adjacent second electrodes is about 2 μm, which is the same as the width of the top side of the trapezoid; the width of the second electrode 211 is about 3 μm.

Figure 3:
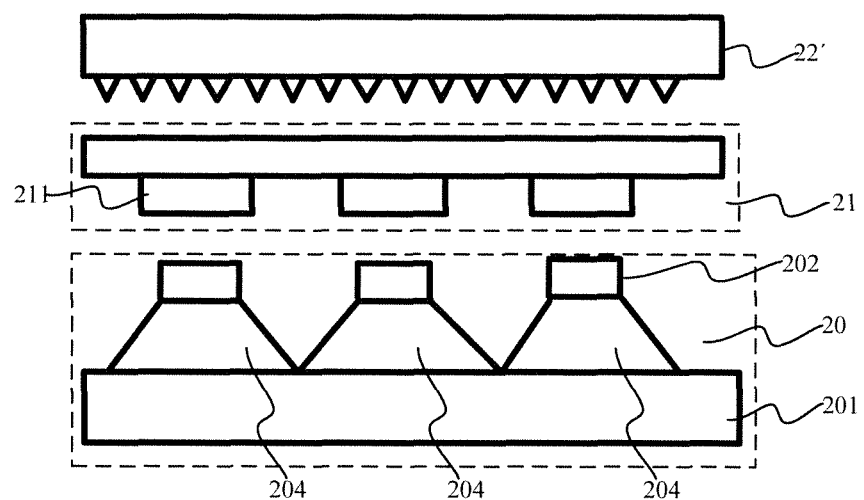
FIG. 3 is a schematic view of a connecting structure by pressing of another display panel according to an embodiment of the present invention.

FIG. 3 shows another press head 22' used in the fabricating process of the display panel according to another embodiment. Referring to FIG. 3, the display panel may comprise a circuit substrate 20 and a flexible circuit board 21 located on the circuit substrate 20. The press head 22' used in the fabricating process of the display panel can be located on the flexible circuit board 21. As shown in FIG. 3, the face of the press head 22' for contacting with the flexible circuit board 21 is in a dentate structure. Because the heights of the convex structures in the circuit substrate may be uneven, such that the distance between some first electrodes 202 and the corresponding second electrodes 211 may be relatively large, the first electrodes and the second electrodes may not be able to connect or may be poorly connected during the pressing process. By designing the face of the press head 22' for contacting with the flexible circuit board 21 to be a dentate structure, the flexible circuit board 21 can produce a deformation with the same shape during the pressing process, thereby being able to eliminate poor connection caused by uneven height of the convex structures 204.

An embodiment of the present invention further provides a display device comprising the above display panel.

The circuit substrate in the embodiment of the present invention comprises convex structures arranged between the substrate and the first electrodes, wherein the convex structure comprises a top face and a bottom face, and wherein the top face contacts with the first electrode and the bottom face contacts with the substrate, thereby the height between the first electrode and the substrate is increased, which enables the first electrodes and the second electrode to be electrically connected through pressing process, without needing to arrange ACF between the circuit substrate and the flexible circuit board. Therefore, it can eliminate the limitation of the ACF to the minimum pressing width and the minimum insulating distance of the first electrodes and the second electrodes, such that the circuit substrate and the corresponding flexible circuit board can realize good connection even in the case of a very small pressing width, thereby solving the problem of a relatively large electrode pitch of the circuit substrate in the prior art while reducing the production cost.

Apparently, the skilled person in the art can make various modifications and variations to the embodiments of the present invention without departing from the spirit and scope of the present invention. In this way, these modifications and variations of the present invention fall within the scope of the claims of the present invention and equivalents thereof, and the present invention intends to encompass these modifications and variations as well.

The invention claimed is:

1. A circuit substrate comprising a substrate and a plurality of first electrodes arranged on the substrate, wherein the circuit substrate further comprises insulating convex structures arranged between the substrate and the first electrodes, the convex structure comprising a top face and a bottom face, wherein the top face contacts with the first electrode, and the bottom face contacts with the substrate,
wherein the first electrodes can be in direct contact with second electrodes arranged on a flexible circuit board located on the circuit substrate.

2. The circuit substrate as claimed in claim 1, wherein the convex structure has a height of 1-2 μm in a direction perpendicular to the substrate.

3. The circuit substrate as claimed in claim 1, wherein shape of the top face of the convex structure matches with the shape of the first electrode.

4. The circuit substrate as claimed in claim 1, wherein the bottom faces of the convex structures are connected with one another and cover the substrate.

5. The circuit substrate as claimed in claim 1, wherein the area of the top face of the convex structure is smaller than the area of the bottom face of the convex structure.

6. The circuit substrate as claimed in claim 5, wherein the section plane of the convex structure in a direction perpendicular to the extending direction of the first electrode and perpendicular to the substrate is in the shape of a trapezoid.

7. The circuit substrate as claimed in claim 1, wherein the convex structure is made of a resin material.

8. A display panel comprising a circuit substrate and a flexible circuit board located on the circuit substrate,
wherein the circuit substrate comprises a substrate and a plurality of first electrodes arranged on the substrate, wherein the circuit substrate further comprises insulating convex structures arranged between the substrate and the first electrodes, the convex structure comprising a top face and a bottom face, wherein the top face contacts with the first electrode, and the bottom face contacts with the substrate, and wherein the first electrodes arranged on the circuit substrate are in direct contact with second electrodes arranged on the flexible circuit board.

9. The display panel as claimed in claim 8, wherein the convex structure has a height of 1-2 μm in a direction perpendicular to the substrate.

10. The display panel as claimed in claim 8, wherein the shape of the top face of the convex structure matches with the shape of the first electrode.

11. The display panel as claimed in claim 8, wherein the bottom faces of the convex structures are connected with one another and cover the substrate.

12. The display panel as claimed in claim 8, wherein the convex structure is made of a resin material.

13. The display panel as claimed in claim 8, wherein the area of the top face of the convex structure is smaller than the area of the bottom face of the convex structure.

14. The display panel as claimed in claim 13, wherein the section plane of the convex structure in a direction perpendicular to the extending direction of the first electrode and perpendicular to the substrate is in the shape of a trapezoid.

15. The display panel as claimed in claim 14, wherein the flexible circuit board is provided with second electrodes corresponding to each of the first electrodes respectively, wherein the side of the trapezoid that contacts with the first electrode is a top side of the trapezoid, the side of the trapezoid that contacts with the substrate is a bottom side of the trapezoid;

the width of the top side of the trapezoid is not larger than a spacing distance between two adjacent second electrodes; the width of the bottom side of the trapezoid is equal to a distance between the same positions of two adjacent second electrodes.

16. A display device comprising a display panel which comprises a circuit substrate and a flexible circuit board located on the circuit substrate, wherein the circuit substrate comprises a substrate and a plurality of first electrodes arranged on the substrate, wherein the circuit substrate further comprises insulating convex structures arranged between the substrate and the first electrodes, the convex structure comprising a top face and a bottom face, wherein the top face contacts with the first electrode, and the bottom face contacts with the substrate, and wherein the first electrodes arranged on the circuit substrate are in direct contact with second electrodes arranged on the flexible circuit board.

17. The display device as claimed in claim 16, wherein the section plane of the convex structure in a direction perpendicular to the extending direction of the first electrode and perpendicular to the substrate is in the shape of a trapezoid.

18. The display device as claimed in claim 17, wherein the flexible circuit board is provided with second electrodes corresponding to each of the first electrodes respectively, wherein the side of the trapezoid that contacts with the first electrode is a top side of the trapezoid, and the side of the trapezoid that contacts with the substrate is a bottom side of the trapezoid;

the width of the top side of the trapezoid is not larger than a spacing distance between two adjacent second electrodes; the width of the bottom side of the trapezoid is equal to a distance between the same positions of two adjacent second electrodes.

* * * * *